(12) United States Patent
Wang et al.

(10) Patent No.: US 9,397,279 B2
(45) Date of Patent: Jul. 19, 2016

(54) ELECTRIC CONDUCTIVE HEAT DISSIPATION SUBSTRATE

(71) Applicant: Industrial Technology Research Institute, Hsinchu (TW)

(72) Inventors: Cheng-Chuan Wang, Changhua County (TW); Cheng-Chou Wong, Hsinchu County (TW); Chia-Ying Yen, Changhua County (TW); Hsin-Hwa Chen, New Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 177 days.

(21) Appl. No.: 14/287,205

(22) Filed: May 27, 2014

(65) Prior Publication Data

US 2015/0188016 A1 Jul. 2, 2015

(30) Foreign Application Priority Data

Dec. 27, 2013 (TW) .............................. 102148786 A

(51) Int. Cl.
*H01L 33/64* (2010.01)
*B32B 15/04* (2006.01)
(Continued)

(52) U.S. Cl.
CPC ............... *H01L 33/641* (2013.01); *C23C 28/00* (2013.01); *C23C 28/30* (2013.01); *C23C 28/32* (2013.01); *C23C 28/321* (2013.01); *C23C 28/322* (2013.01); *C23C 28/324* (2013.01); *C23C 28/34* (2013.01); *C23C 30/00* (2013.01); *C23C 30/005* (2013.01); *H01L 23/00* (2013.01); *H05K 1/0271* (2013.01); *H05K 1/0306* (2013.01); *H05K 3/185* (2013.01); *H05K 3/188* (2013.01);
(Continued)

(58) Field of Classification Search
CPC ........ C23C 28/00; C23C 28/30; C23C 28/32; C23C 28/321; C23C 28/322; C23C 28/324; C23C 28/34; C23C 30/00; C23C 30/005; Y10T 428/12903; Y10T 428/1291; Y10T 428/12882; Y10T 428/12889; Y10T 428/12896; Y10T 428/12944; Y10T 428/12931; Y10T 428/12576; Y10T 428/12611; Y10T 428/12618; Y10T 428/24967; Y10T 428/24975; Y10T 428/2495; Y10T 428/24959; Y10T 428/265; Y10T 428/264; Y10T 428/263
See application file for complete search history.

(56) References Cited

U.S. PATENT DOCUMENTS 5,561,321 A 10/1996 Hirano et al.
2011/0079418 A1 4/2011 Furuichi et al.

FOREIGN PATENT DOCUMENTS

TW 179055 2/1992
TW I271238 1/2007
(Continued)

OTHER PUBLICATIONS

Machine Translation, Tong Hsing Electronic Industries, TW M438786, Oct. 2012.*
(Continued)

*Primary Examiner* — Michael E La Villa
(74) *Attorney, Agent, or Firm* — Jianq Chyun IP Office

(57) ABSTRACT

An electric conduction heat dissipation substrate includes a ceramic substrate, and a seed layer, and a buffering material layer and a copper circuit layer formed thereon in order. The buffering material layer has a coefficient of thermal expansion between those of the ceramic substrate and the copper circuit layer. Moreover, the buffering material layer is composed of alloy material and ceramic material or composed of metal material and ceramic material.

11 Claims, 7 Drawing Sheets

(51) Int. Cl.
  *B32B 18/00*   (2006.01)
  *C23C 28/00*   (2006.01)
  *C23C 30/00*   (2006.01)
  *H01L 23/00*   (2006.01)
  *H05K 1/02*    (2006.01)
  *H05K 1/03*    (2006.01)
  *H05K 3/18*    (2006.01)
  *H01L 33/62*   (2010.01)

(52) U.S. Cl.
  CPC ........ *H01L 33/62* (2013.01); *H01L 2924/0002* (2013.01); *H05K 2203/072* (2013.01); *H05K 2203/0709* (2013.01); *H05K 2203/0723* (2013.01); *Y10T 428/1291* (2015.01); *Y10T 428/12576* (2015.01); *Y10T 428/12611* (2015.01); *Y10T 428/12618* (2015.01); *Y10T 428/12882* (2015.01); *Y10T 428/12889* (2015.01); *Y10T 428/12896* (2015.01); *Y10T 428/12903* (2015.01); *Y10T 428/12931* (2015.01); *Y10T 428/12944* (2015.01); *Y10T 428/2495* (2015.01); *Y10T 428/24959* (2015.01); *Y10T 428/24967* (2015.01); *Y10T 428/24975* (2015.01); *Y10T 428/263* (2015.01); *Y10T 428/264* (2015.01); *Y10T 428/265* (2015.01)

(56) References Cited

FOREIGN PATENT DOCUMENTS

| | | |
|---|---|---|
| TW | 200707799 | 2/2007 |
| TW | I305131 | 1/2009 |
| TW | 200913326 | 3/2009 |
| TW | I335792 | 1/2011 |
| TW | I352407 | 11/2011 |
| TW | M438786 | 10/2012 |
| TW | M439263 | 10/2012 |
| TW | 201306343 | 2/2013 |
| TW | M452600 | 5/2013 |
| TW | I403576 | 8/2013 |

OTHER PUBLICATIONS

"Office Action of Taiwan Counterpart Application," issued on Aug. 18, 2015, p. 1-p. 5.

Zhu et al., "Composite electroforming of Cu/SiCp composites," The Chinese Journal of Nonferrous Metals, Jan. 2004, pp. 84-87.

Hattali et al., "Study of SiC—nickel alloy bonding for high temperature applications," Journal of the European Ceramic Society, Jan. 6, 2012, pp. 813-819.

Schubert et al., "Interfacial design of Cu-based composites prepared by powder metallurgy for heat sink applications," Materials Science and Engineering, Feb. 25, 2008, pp. 39-44.

Weber and Tavangar, "On the influence of active element content on the thermal conductivity and thermal expansion of Cu—X (X=Cr, B) diamond composites," Scripta Materialia, Dec. 2007, pp. 988-991.

Chen et al., "Thermal expansion and mechanical properties of high reinforcement content SiCp/Cu composites fabricated by squeeze casting technology," Transactions of Nonferrous Metals Society of China, Dec. 2009, pp. s600-s604.

\* cited by examiner

ELECTRIC CONDUCTIVE HEAT DISSIPATION SUBSTRATE

CROSS-REFERENCE TO RELATED APPLICATION

This application claims the priority benefit of Taiwan application no. 102148786, filed on Dec. 27, 2013. The entirety of the above-mentioned patent application is hereby incorporated by reference herein and made a part of this specification.

TECHNICAL FIELD

The technical field relates to an electric conductive heat dissipation substrate.

BACKGROUND

The continuous progress of LED material and packaging technology promotes the continuous improvement in luminous efficiency of LED product. The product application covers fields of portable products, billboards, display backlight units, cars, lightings, and so on, so the market scale and development force are quite remarkable. Following the application development of high-efficiency LED product, LED heat dissipation technology has become the issue that every company is keen to solve. Besides, as for the selection of LED heat dissipation substrate, there is difference in design according to conditions including the circuit design, size or light emitting efficiency of LED. However, following the development of high-brightness high-efficiency LED and the application trend of high-density packaging, the heat dissipation problem thereof faces more and more strict tests as the development of CPU. If the problem is not solved in a timely manner, the life and light intensity of LED will be affected. As for the traditional LED, the heat generation is low and the heat dissipation problem is not serious, so the application of copper foil printed circuit board (PCB) for general electronic industry will be enough. However, following the prevalence of high-efficiency LED, copper foil printed circuit board (PCB) is not enough for heat dissipation requirements. In order to ensure the heat dissipation stability of LED and the luminous efficiency of LED grain, it is required to manufacture metal fine circuits on ceramic substrates to solve heat problem. However, the finest circuit width of direct bonded copper (DBC) substrate is about 150 um, and the thermal expansion coefficient thereof is quite high, which is 17 ppm/K, so the difference between it and 4-6 ppm/K of highly insulated $Al_2O_3$ or AlN ceramic substrates is quite high. Hence, the stability of heat circulation is always a concern for users.

The manufacturing method of high-efficiency LED heat dissipation substrate with ceramic material comprises four ways, i.e. low temperature co-fired ceramic (LTCC), high temperature co-fired ceramic (HTCC), direct bonded copper (DBC) substrate, and direct plated copper (DPC) substrate. The manufacturing temperature of HTCC is about 1300-1600° C., which makes the selection of electrode material is limited, and the manufacturing cost is quite high. As for LTCC, the co-fired temperature is lowered under about 850° C., but the technology issues including size accuracy and product strength thereof are still required to be broken through. DBC combines $Al_2O_3$ and Cu plates by high temperature heating, but the technology issue is that, it's not easy to solve the problem of micro voids between $Al_2O_3$ and Cu plates, resulting in bigger challenge to mass production energy and yield rate of the product.

Another technology is direct plated copper (DPC) substrate, and the circuit width thereof is smaller. However, direct plated copper (DPC) substrate has problems of copper removal and electric leakage, and the thermal expansion coefficient thereof is quite high (17 ppm/K), so the difference between it and highly insulated $Al_2O_3$ or AlN ceramic substrate (4-6 ppm/K) is quite high. Hence, the stability of heat circulation is a big problem.

SUMMARY

The disclosure provides an electric conductive heat dissipation substrate, comprising a ceramic substrate, a seed layer, a buffering material layer and a copper circuit layer. The seed layer is on the ceramic substrate; the buffering material layer is formed on the seed layer; the copper circuit layer is on the buffering material layer. The thermal expansion coefficient of the buffering material layer is between those of the ceramic substrate and the copper circuit layer. In addition, a material of the buffering material layer is composed of metal material and ceramic material, or composed of alloy material and ceramic material.

Several exemplary embodiments accompanied with figures are described in detail below to further describe the disclosure in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DESCRIPTION OF THE EMBODIMENTS

Figure 1:
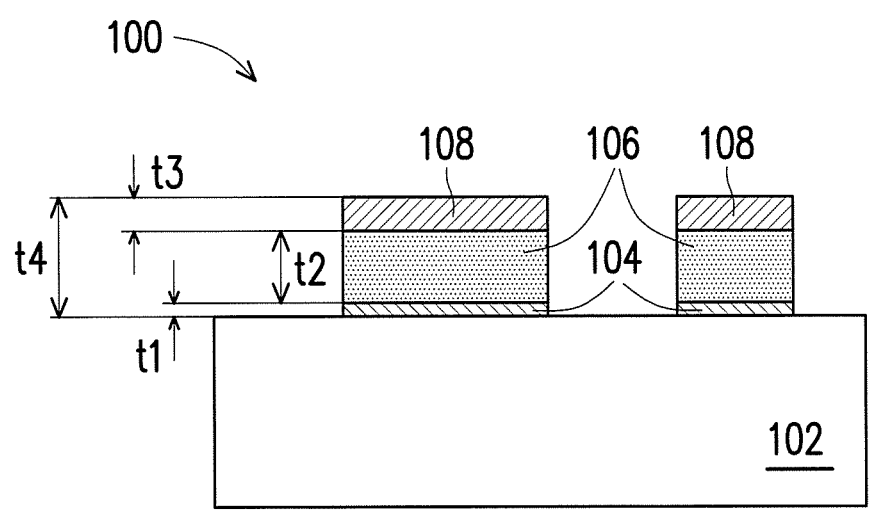
FIG. 1 is a cross-sectional view of an electric conductive heat dissipation substrate according to one embodiment of the disclosure.

FIG. 1 is a cross-sectional view of an electric conductive heat dissipation substrate according to one embodiment of the disclosure.

Please refer to FIG. 1, the electric conductive heat dissipation substrate 100 of the embodiment comprises a ceramic substrate 102, a seed layer 104, a buffering material layer 106 and a copper circuit layer 108. In FIG. 1, the seed layer 104 is on the ceramic substrate 102, the buffering material layer 106 is formed on the seed layer 104, and the copper circuit layer 108 is on the buffering material layer 106. The material of the ceramic substrate 102 is aluminum oxide, aluminum nitride or silicon carbide, for example. The thermal expansion coefficient (CTE) of the buffering material layer 106 is between those of the ceramic substrate 102 and the copper circuit layer 108, and thus the electric conductive heat dissipation substrate 100 become a heat dissipation substrate of gradient thermal expansion coefficient wholly, such that the heat stability of the copper circuit layer 108 on the ceramic substrate 102 may be increased and compatible in the current fine circuit manufacturing process.

In the embodiment, the material of the buffering material layer 106 is composed of metal material and ceramic material or composed of alloy material and ceramic material. The metal material is one selected from the group consisting of copper, nickel, cobalt, silver and gold, for example. The alloy material is one selected from the group consisting of copper-tungsten, copper-manganese, nickel-tungsten, cobalt-tungsten, copper-molybdenum, nickel-molybdenum, cobalt-molybdenum, nickel-tungsten-phosphorous, nickel-tungsten-boron, cobalt-tungsten-phosphorous, cobalt-tungsten-boron and cobalt-molybdenum-boron, for example. The ceramic material is one selected from the group consisting of silicon carbide, aluminum oxide, zirconium oxide, cerium oxide, tungsten carbide, titanium oxide, and silicon dioxide or the mixture thereof, for example. Therefore, the buffering material layer 106 may comprise two kinds or more of ceramic materials. Besides, the particle size of the ceramic material is less than 10 μm, for example. In addition, the buffering material layer 106 may comprise 40 wt. % to 95 wt. % metal material or alloy material, and 5 wt. % to 60 wt. % ceramic material.

Please continue referring to FIG. 1, the buffering material layer 106 is manufactured through electroplating or electroless plating manufacturing process, so it is required to form the seed layer 104 on the ceramic substrate 102 first. The seed layer 104 is one selected from the group consisting of nickel-phosphorous alloy, nickel-boron alloy, nickel-tungsten-phosphorous alloy, nickel-molybdenum-phosphorous alloy, nickel-tungsten-boron alloy, nickel-molybdenum-boron alloy, cobalt-phosphorous alloy, cobalt-boron alloy, cobalt-tungsten-phosphorous alloy, cobalt-molybdenum-phosphorous alloy, cobalt-tungsten-boron alloy and cobalt-molybdenum-boron alloy, or the mixture thereof.

In addition, the thickness t1 of the seed layer 104 is, for example, less than 5 μm for performing the electroplating or electroless plating manufacturing process on the ceramic substrate 102, so it is unnecessary to be too thick. The thickness t2 of the buffering material layer 106 is 1 time or more of the thickness t3 of the copper circuit layer 108, wherein the thickness t3 of the copper circuit layer is less than 50 μm, for example. Therefore, in one embodiment, the total thickness t4 of the seed layer 104, the buffering material layer 106 and the copper circuit layer 108 is less than 100 μm. However, the disclosure is not limited thereto.

The electric conductive heat dissipation substrate 100 of the embodiment includes multiple materials of different thermal expansion coefficients, so the interface thermal stress may be adjusted through those thermal expansion coefficients of different materials, which is applicable for every kind of high-efficiency LED product (such as billboards, display backlight units, and lightings) or thermoelectric devices.

FIG. 2A to FIG. 2E are cross-sectional views of the manufacturing process of an electric conductive heat dissipation substrate of another embodiment of the disclosure.

Figure 2A:
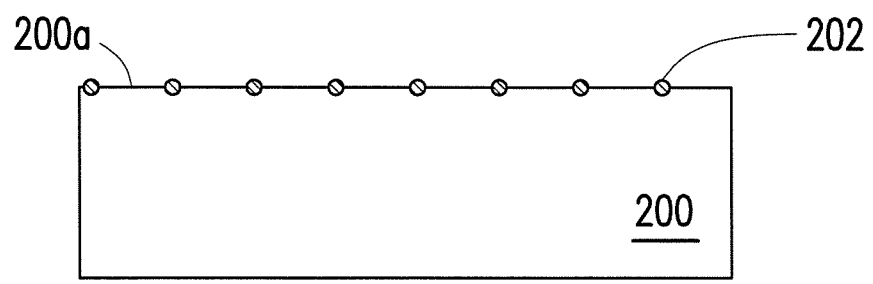
FIG. 2A to FIG. 2E are cross-sectional views of the manufacturing process of an electric conductive heat dissipation substrate of another embodiment of the disclosure.

Please refer to FIG. 2A 'an electroless plating metallization manufacturing process is performed on a surface 200a of a ceramic substrate 200 first. Hence, the surface 200a is activated first. For example, a palladium activation manufacturing process is performed in order to form palladium particles 202.

Figure 2B:
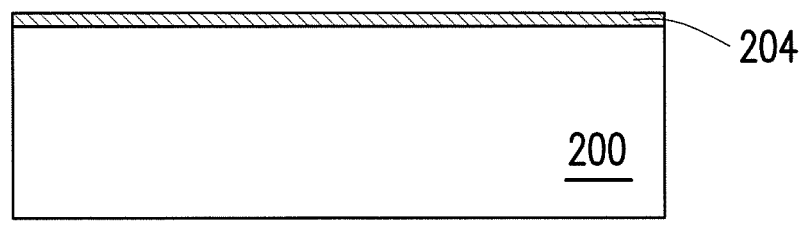

Afterwards, please refer to FIG. 2B, an electroless plating manufacturing process, e.g. electroless plating nickel manufacturing process, is performed in order to faun a seed layer 204.

Figure 2C:
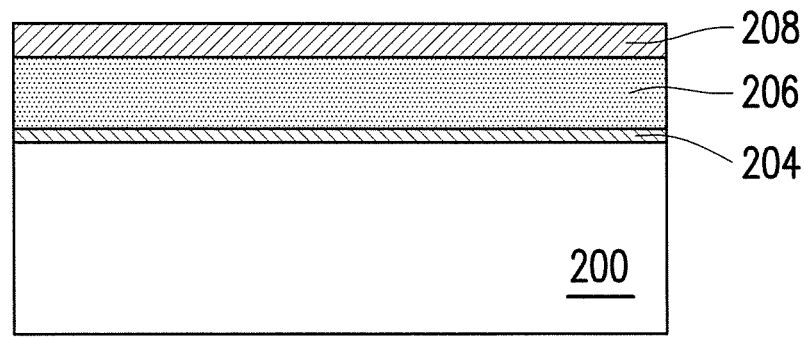

Next, please refer to FIG. 2C, a buffering material layer 206 and a copper layer 208 are subsequently plated on the seed layer 204 to form the copper metal electrode material.

Figure 2D:
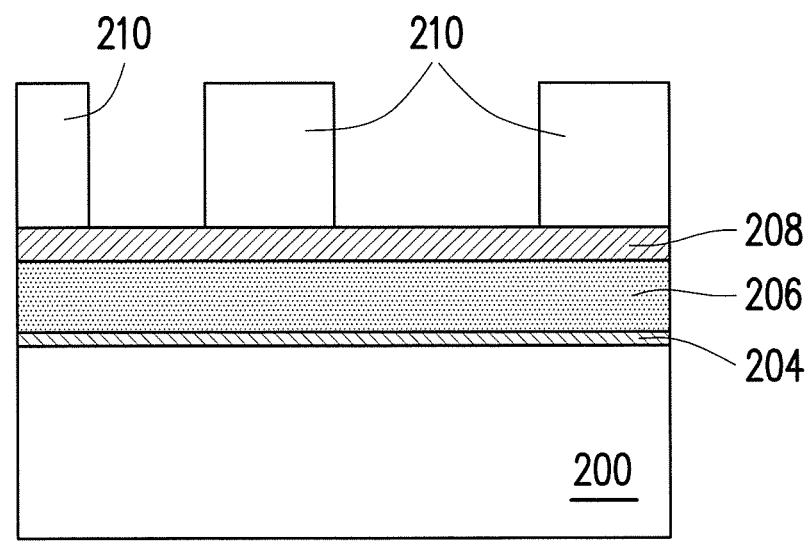

Afterwards, please refer to FIG. 2D, the photoresist layer 210 is formed on the copper layer 208 through an exposure development process.

Figure 2E:
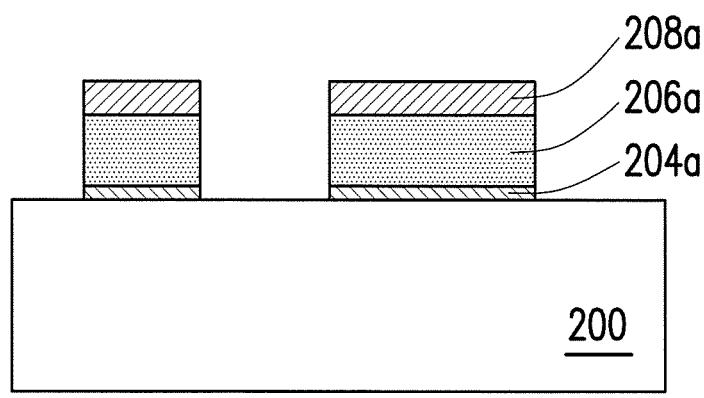

Next, please refer to FIG. 2E, with the photoresist layer 210 of FIG. 2D as the mask, a metal etching process is performed to remove the copper layer 208, the buffering material layer 206 and the seed layer 204 covered by the photoresist layer 210. The photoresist layer 210 is then removed, so that the fine circuit of the copper circuit layer 208a, the buffering material layer 206a and the seed layer 204a is obtained. Besides, according to the embodiment, the fine circuit may be less than 30 μm.

FIG. 3A to FIG. 3E are cross-sectional views of the manufacturing process of an electric conductive heat dissipation substrate of another embodiment of the disclosure.

Figure 3A:
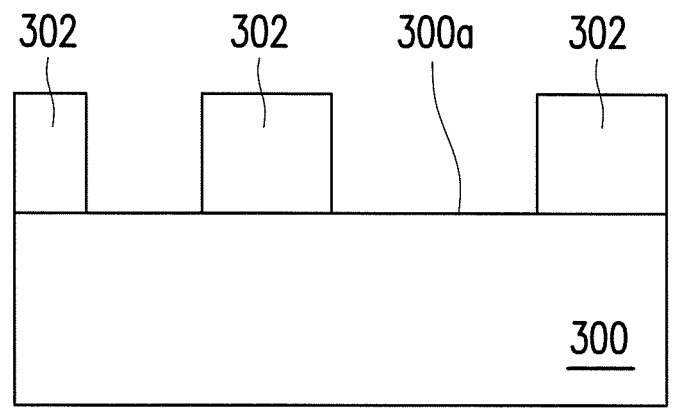
FIG. 3A to FIG. 3E are cross-sectional views of the manufacturing process of an electric conductive heat dissipation substrate of another embodiment of the disclosure.

Please refer to FIG. 3A, a photoresist layer 302 is formed on the ceramic substrate 300 through an exposure development process to expose a surface 300a for forming electrodes subsequently.

Figure 3B:
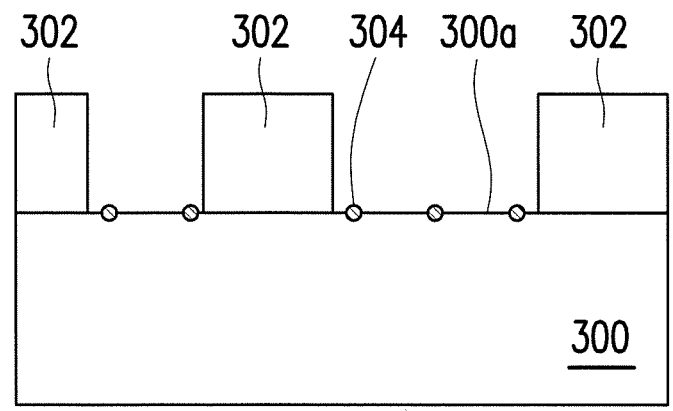

Afterwards, please refer to FIG. 3B, the surface 300a of the ceramic substrate 300 is activated. For example, a palladium activation manufacturing process is performed in order to form palladium particles 304.

Figure 3C:
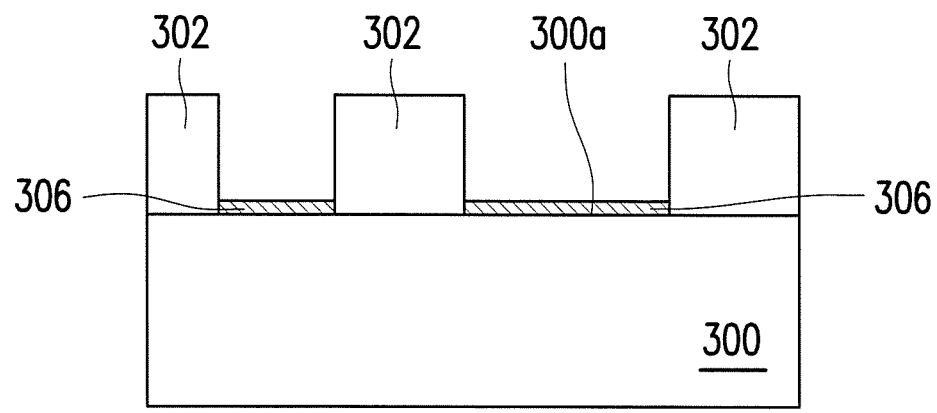

Next, please refer to FIG. 3C, an electroless plating manufacturing process, e.g. electroless nickel plating manufacturing process, is performed in order to form a seed layer 306 on the surface 300a of the ceramic substrate 300.

Afterwards, please refer to FIG. 3D, a buffering material layer 308 and a copper circuit layer 310 are subsequently plated on the seed layer 306 to a certain thickness.

Figure 3D:
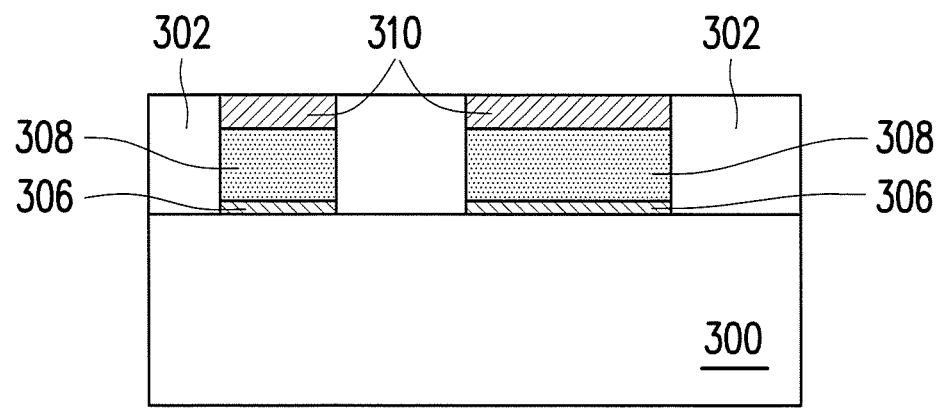
Figure 3E:
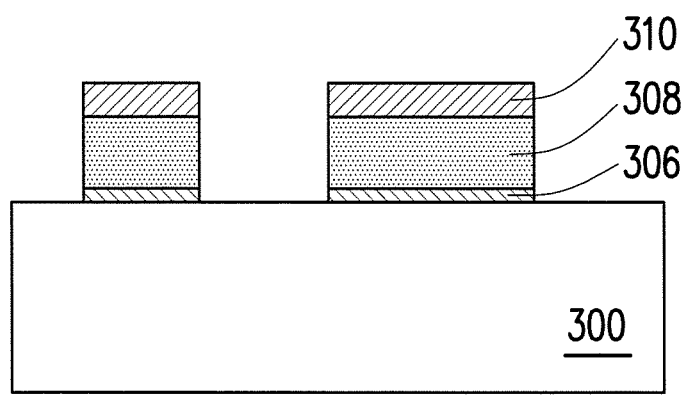

Finally, please refer to FIG. 3E, the photoresist layer 302 of FIG. 3D is removed. The circuit manufactured according to the embodiment may be less than 30 μm.

The manufacturing temperature in above two embodiments are both lower than 100° C., so the energy is saved, the cost is lowered, and good bonding is formed between ceramic and copper metal.

The following are some experiments to prove the effects of the disclosure, but the scope of the disclosure is not limited to the following experiments.

Preparation 1

First, on an aluminum oxide ceramic substrate with a thickness of 300 μm, a chemical plating nickel (Ni—P) is formed to a thickness of 3 μm. Next, a buffering material layer is electroplated by an electroplating nickel solution to form a nickel silicon carbide (Ni—SiC) buffering material layer with a thickness about 20 μm, wherein the electroplating nickel solution comprises nickel sulfate 450 g/L, silicon carbide (particle size 3 μm) 100 g/L, nickel chloride 5 g/L, boric acid 40 g/L, and a surfactant 5 ml/L. Afterwards, a copper metal material is deposited in an electroplating copper solution to form a 10 μm-thickness copper layer on the buffering material layer. Subsequently, an exposure development process and a metal etching process are performed in order, and then a copper circuit heat dissipation substrate comprising the buffering material layer is formed after removing the photoresist layer. SiC is about 6±2 wt. % of the buffering material layer through EDS analysis of scanning electron microscope (SEM).

Experiment 1: Heat Stability Experiment

After 4 hours experiment under 300° C. atmosphere, the copper circuit heat dissipation substrate obtained from Preparation 1 is observed by SEM, and there is no crack in the aluminum oxide ceramic substrate.

Besides, a substrate manufactured through direct bonded copper (DBC) substrate manufacturing process is prepared to be observed by SEM after 4 hours experiment under 300° C.

atmosphere, and there are cracks and distortion in the aluminum oxide ceramic substrate with a thickness of 300 μm.

Preparation 2

First, on an aluminum oxide ceramic substrate with a thickness of 300 μm, a chemical plating nickel (Ni—P) is formed to a thickness of 3 μm. Next, a cobalt-tungsten (Co—W) electroplating is performed to form a cobalt-tungsten (Co—W) buffering material layer with a thickness of 20 μm, wherein the electroplating cobalt-tungsten solution comprises cobalt sulfate 25 g/L, sodium tungstate 30 g/L, sodium citrate 50 g/L, ammonium chloride 10 g/L, and a surfactant 5 g/L. Afterwards, a copper metal material is deposited in the electroplating copper solution to form a 10 μm-thickness copper layer on the buffering material layer. Subsequently, an exposure development process and a metal etching process are performed in order, and then a copper circuit heat dissipation substrate comprising the buffering material layer is formed after removing the photoresist layer.

Experiment 2: Heat Stability Experiment

After 4 hours experiment under 300° C. atmosphere, the copper circuit heat dissipation substrate obtained from Preparation 2 is observed by SEM, and there is no delamination between the $Al_2O_3$ substrate and the Co—W buffering material layer.

Preparation 3

Chemical plating nickel (Ni—P) is formed to a thickness of 3 μm on an aluminum oxide ceramic substrate with thickness of 300 μm. Next, a buffering material layer is electroplated by an electroplating nickel solution to form a nickel silicon carbide (Ni—SiC) buffering material layer with a thickness of 20 μm, wherein the electroplating nickel solution comprises nickel sulfate 450 g/L, silicon carbide (particle size 3 μm) 200 g/L, nickel chloride 5 g/L, boric acid 40 g/L, and a surfactant 5 ml/L. Afterwards, a copper metal material is deposited in the electroplating copper solution to form a 10 μm-thickness copper layer on the buffering material layer. Subsequently, an exposure development process and a metal etching process are performed in order, and then a copper circuit heat dissipation substrate comprising the buffering material layer is formed after removing the photoresist layer. SiC is about 50±5 wt. % of the buffering material layer through EDS analysis of SEM.

Experiment 3: Heat Stability Experiment

After 4 hours experiment under 300° C. atmosphere, the copper circuit heat dissipation substrate obtained from Preparation 3 is observed by SEM, and there is no delamination on the substrate.

Preparation 4

By performing the same method as Preparation 1, a copper circuit heat dissipation substrate comprising buffering material layer is made. However, except for SiC, another ceramic material $Al_2O_3$ is also added into the buffering material layer. The detailed formulation of the electroplating nickel solution comprises nickel sulfate 450 g/L, silicon carbide (particle size 3 μm) 50 g/L, aluminum oxide (particle size 2-3 μm) 50 g/L, nickel chloride 5 g/L, boric acid 40 g/L, and a surfactant 5 ml/L.

Experiment 4: Heat Stability Experiment

After 4 hours experiment under 300° C. atmosphere, the copper circuit heat dissipation substrate obtained from Preparation 4 is observed by SEM, and there is no delamination on the substrate.

As the aforementioned, the disclosure provides a buffering material layer between the ceramic substrate and the copper circuit layer, with the thermal expansion coefficient between the two, in order to form a heat dissipation substrate of gradient thermal expansion coefficient, so the heat stability of the metal copper circuit layer on the ceramic substrate may be increased and compatible in the current fine circuit manufacturing process. Besides, the manufacturing temperature of the buffering material layer is lower than 100° C., so the energy is saved and the cost is lowered, and good bonding is formed between the ceramic substrate and the copper circuit layer. Therefore, the electric conductive heat dissipation substrate of the present disclosure is applicable for every kind of high-efficiency LED product or thermoelectric devices.

It will be apparent to those skilled in the art that various modifications and variations may be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. An electric conductive heat dissipation substrate, comprising:
    a ceramic substrate;
    a seed layer, on the ceramic substrate, wherein the seed layer is one selected from the group consisting of nickel-phosphorous alloy, nickel-boron alloy, nickel-tungsten-phosphorous alloy, nickel-molybdenum-phosphorous alloy, nickel-tungsten-boron alloy, nickel-molybdenum-boron alloy, cobalt-phosphorous alloy, cobalt-boron alloy, cobalt-tungsten-phosphorous alloy, cobalt-molybdenum-phosphorous alloy, cobalt-tungsten-boron alloy and cobalt-molybdenum-boron alloy, or a mixture thereof;
    a buffering material layer, formed on the seed layer; and
    a copper circuit layer, on the buffering material layer, wherein
    a thermal expansion coefficient of the buffering material layer is between those of the ceramic substrate and the copper circuit layer, and
    the buffering material layer is composed of a metal material and a ceramic material, or is composed of an alloy material and the ceramic material.

2. The electric conductive heat dissipation substrate according to claim 1, wherein the metal material is one selected from the group consisting of copper, nickel, cobalt, silver and gold.

3. The electric conductive heat dissipation substrate according to claim 1, wherein the alloy material is one selected from the group consisting of copper-tungsten, copper-manganese, nickel-tungsten, cobalt-tungsten, copper-molybdenum, nickel-molybdenum, cobalt-molybdenum, nickel-tungsten-phosphorous, nickel-tungsten-boron, cobalt-tungsten-phosphorous, cobalt-tungsten-boron, and cobalt-molybdenum-boron.

4. The electric conductive heat dissipation substrate according to claim 1, wherein the ceramic material is one selected from the group consisting of silicon carbide, aluminum oxide, zirconium oxide, cerium oxide, tungsten carbide, titanium oxide and silicon dioxide, or a mixture thereof.

5. The electric conductive heat dissipation substrate according to claim 1, wherein the buffering material layer comprises:
    40 wt. % to 95 wt. % of the metal material or the alloy material; and
    5 wt. % to 60 wt. % of the ceramic material.

6. The electric conductive heat dissipation substrate according to claim 1, wherein a particle size of the ceramic material in the buffering material layer is less than 10 μm.

7. The electric conductive heat dissipation substrate according to claim 1, wherein a thickness of the buffering material layer is 1 time or more of a thickness of the copper circuit layer.

8. The electric conductive heat dissipation substrate according to claim 1, wherein a thickness of the copper circuit layer is less than 50 μm.

9. The electric conductive heat dissipation substrate according to claim 1, wherein a material of the ceramic substrate comprises aluminum oxide, aluminum nitride or silicon carbide.

10. The electric conductive heat dissipation substrate according to claim 1, wherein a thickness of the seed layer is less than 5 μm.

11. The electric conductive heat dissipation substrate according to claim 1, wherein a total thickness of the seed layer, the buffering material layer and the copper circuit layer is less than 100 μm.

\* \* \* \* \*